United States Patent
Chen et al.

(10) Patent No.: US 7,211,500 B2
(45) Date of Patent: May 1, 2007

(54) PRE-PROCESS BEFORE CUTTING A WAFER AND METHOD OF CUTTING A WAFER

(75) Inventors: Kuo-Ming Chen, Beipu Township, Hsinchu County (TW); Kun-Chih Wang, Hsinchu (TW); Hermen Liu, Hsinchu (TW); Paul Chen, Hsinchu (TW); Kai-Kuang Ho, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 238 days.

(21) Appl. No.: 10/950,909

(22) Filed: Sep. 27, 2004

(65) Prior Publication Data

US 2006/0073676 A1 Apr. 6, 2006

(51) Int. Cl.
*H01L 21/46* (2006.01)
*H01L 21/78* (2006.01)
*H01L 21/301* (2006.01)

(52) U.S. Cl. .................. 438/460; 438/68; 438/113; 257/E21.238; 257/E21; 257/483

(58) Field of Classification Search ............... 438/460, 438/68, 113, 42, 57, 463, 524, 535, 700
See application file for complete search history.

(56) References Cited

U.S. PATENT DOCUMENTS

| 5,024,970 | A | * | 6/1991 | Mori ........................ 438/462 |
| 5,096,855 | A | * | 3/1992 | Vokoun, III ............... 438/462 |
| 5,459,340 | A | * | 10/1995 | Anderson et al. ........... 257/203 |
| 5,530,280 | A |   | 6/1996 | White ........................ 257/508 |
| 6,214,703 | B1 | * | 4/2001 | Chen et al. ................. 438/462 |
| 6,734,544 | B2 | * | 5/2004 | Yan et al. ................... 257/690 |
| 6,821,867 | B2 | * | 11/2004 | Matsuura et al. ........... 438/462 |

* cited by examiner

*Primary Examiner*—David Nhu
(74) *Attorney, Agent, or Firm*—J.C. Patents (57) ABSTRACT

A pre-process before cutting a wafer is described. The wafer includes a plurality of scribe lines and a plurality of dies defined by the scribe lines, and a material layer covers the wafer. A pre-processing step is performed to remove the material layer on the scribe lines close to the corner regions of the dies. Removing the material layer at the corner regions before cutting the wafer is able to preserve the integrity of the corner regions of the cut dies.

13 Claims, 10 Drawing Sheets

PRE-PROCESS BEFORE CUTTING A WAFER AND METHOD OF CUTTING A WAFER

BACKGROUND OF THE INVENTION

1. Field of the Invention

The present invention relates to a pre-process before cutting a wafer and a method of cutting a wafer. More particularly, the present invention relates to a pre-process before cutting a wafer and a method of cutting the wafer that can minimize possible damages to the corner regions of cut-out dies.

2. Description of the Related Art

With the rapid advance in electronic technologies, integrated circuits (IC) have been extensively used in out daily life. Typically, integrated circuit manufacturing can be roughly classified into three main stages: a silicon wafer fabrication stage, an integrated circuit fabrication stage and an integrated circuit packaging stage. The very first step in packaging the integrated circuits involves cutting up a wafer into separate dies.

In general, a silicon wafer comprises a plurality of horizontal scribe lines and a plurality of vertical scribe lines that divide the wafer into a multiple of dies. After all the necessary steps for forming semiconductor devices on the wafer are completed, a diamond blade is often used to cut along the scribe lines to separate the dies. Because the wafer is covered with a multitude of non-identical material layers, the material layers on the scribe line may be damaged due to chipping or cracking.

Along the scribe lines, the more serious damages can be found close to the corner regions of the dies due to stress concentration. That is, the junction area of the scribe lines will receive more damage after the cutting process. Moreover, the cracks on these corner-damaged dies may expand or cause a delamination of layers as a result of external stress such as temperature fluctuation. Ultimately, the life of the devices may be shortened and the reliability of the subsequently packaged product may be compromised.

Another frequently used technique for cutting up a wafer is to use a laser beam. However, laser cutting also has its problems. For example, if one of the material layers covering the wafer contains metal, the metal melt in the laser cutting process is hard to dispose and hence may be retained as a debris on the wafer to contaminate the die. Moreover, cutting with a laser beam also leads to the creation of a heat-affected area around each cut die. Due to the heat, the reliability of devices within the heat-affected area may deteriorate. In addition, a laser-cutting machine costs 2~3 times more than a conventional blade sawing machine. Hence, the cost of cutting is a lot higher. Besides, a process for producing crackstops on semiconductor devices is disclosed in U.S. Pat. No. 5,530,280, but the above problems cannot be effectively solved by this method.

SUMMARY OF THE INVENTION

Accordingly, at least one objective of the present invention is to provide a pre-process before wafer cutting such that chipping and cracking at the corner regions of the dies during the cutting process is minimized.

At least a second objective of the present invention is to provide a method of cutting a wafer capable of minimizing the chipping and cracking of the corner regions of dies so that the reliability and working life of the devices is improved.

To achieve these and other advantages and in accordance with the purpose of the invention, as embodied and broadly described herein, the invention provides a pre-process before cutting a wafer. First, a wafer having a plurality of scribe lines and a plurality of dies defined by the scribe lines is provided. Furthermore, the wafer has at least a material layer disposed thereon. Thereafter, a portion of the material layer on the scribe lines close to the corner regions of the dies is removed.

The present invention also provides a method of cutting a wafer. First, a wafer having a plurality of scribe lines and a plurality of dies defined by the scribe lines is provided. Furthermore, the wafer has at least a material layer disposed thereon. Thereafter, a portion of the material layer on the scribe lines close to the corner regions of the dies is removed. Finally, a wafer cutting process is performed.

In the present invention, a pre-process to remove a portion of the material layer on the scribe line is carried out before performing the wafer cutting process. With this arrangement, stress at the corner regions of the dies during the cutting process is minimized and hence the chipping and cracking of the dies around the corner regions is prevented. In other words, the dies cut out from the wafer can have a greater integrity so that the subsequently formed chip packages is more reliable.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Typically, the devices on a wafer have a multi-layered structure. In the process of fabricating these devices, the same material layers are also formed on the scribe lines. When the wafer is cut to form independent dies, the material layers on the scribe lines may crack, peel of chip because of the difference in properties between the layers. Damages are particularly serious at the corner regions of the dies close to the cross-junction of the scribe lines because these are the areas where stresses are concentrated.

To combat such damages, the present invention provides a pre-processing step before cutting the wafer. In the pre-processing step, the material layer on the scribe line close to the corner regions of various dies is removed so that the stress concentration in these regions are reduced. When a wafer cutting process is performed, damages to the edge of the dies are substantially minimized. Hence, integrity of the dies is maintained and reliability of the devices is improved. In the following, a method of cutting a wafer according to a preferred embodiment of the present invention is described.

Figure 1:
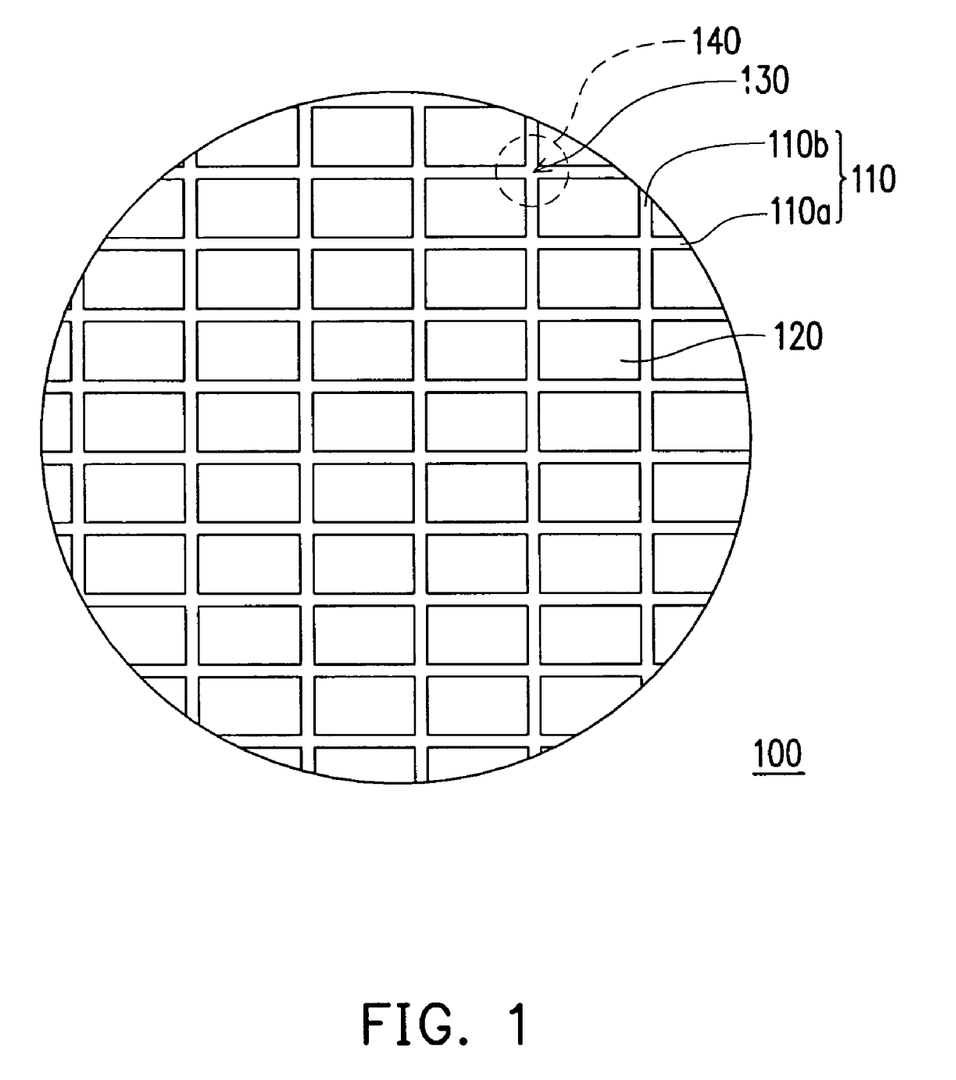
FIG. 1 is a top view of a wafer according to one embodiment of the present invention.

FIG. 1 is a top view of a wafer according to one embodiment of the present invention. First, as shown in FIG. 1, a wafer 100 having a plurality of scribe lines 110 and a plurality of dies 120 defined by the scribe lines 110 is provided. The scribe lines 110 comprise a plurality of parallel disposed horizontal scribe lines 110a and a plurality of parallel disposed vertical scribe lines 110b. Furthermore, at least a material layer covers the wafer 100. In one preferred embodiment, at least a dielectric layer (not shown) and a conductive layer (not shown) covers the wafer 100. The dielectric layer is fabricated using a low dielectric constant (K) material or other dielectric material and the conductive layer is fabricated using copper or other conductive material, for example.

Thereafter, the material layers on the scribe lines 110 corresponding to the corner regions of various dies 120 are removed. The so-called material layers on the scribe lines 110 corresponding to the corner region of various dies 120 refers to the material layer (area indicated by an arrow having a label 130) on the scribe lines 110 at a definite width away from the dies. The material layers on the scribe lines can be removed using laser, performing a patterning process or some other suitable processes.

In one embodiment of the present invention, a portion of the wafer surface will be exposed after removing part of the material layers so that the probability of chipping and cracking due to the presence of different material layers during a wafer cutting process is significantly minimized.

Figure 2A:
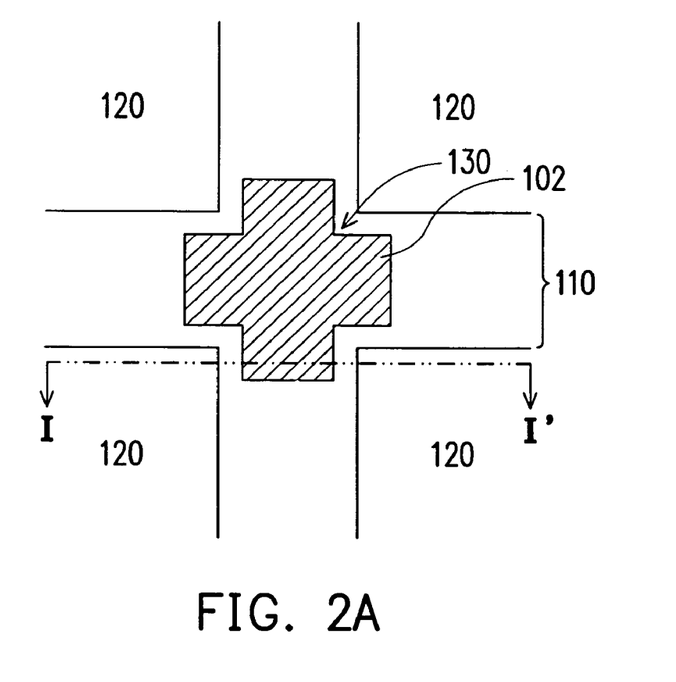
FIGS. 2A through 2F are top views showing various types of recess patterns on the cross-junction area of the scribe lines according to one preferred embodiment of the present invention.
Figure 2B:
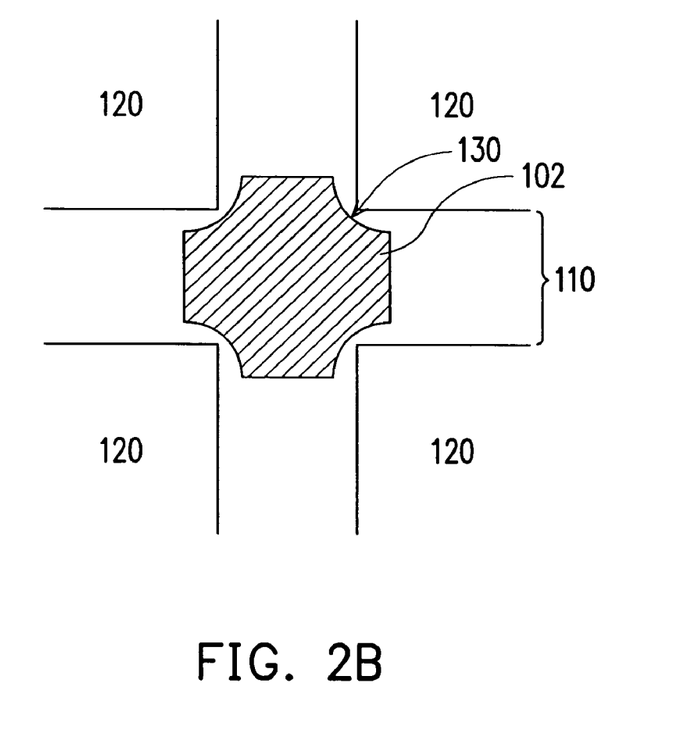
Figure 2C:
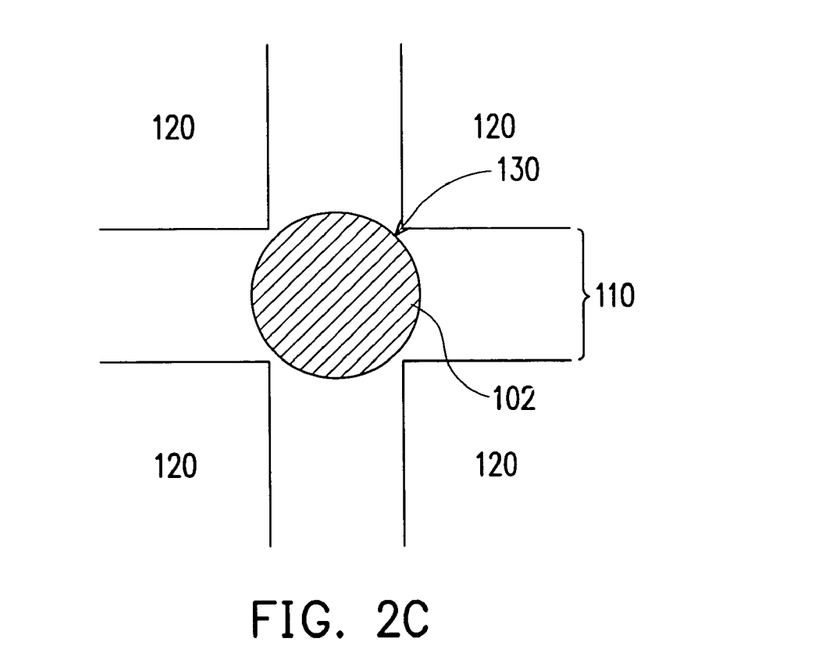
Figure 2D:
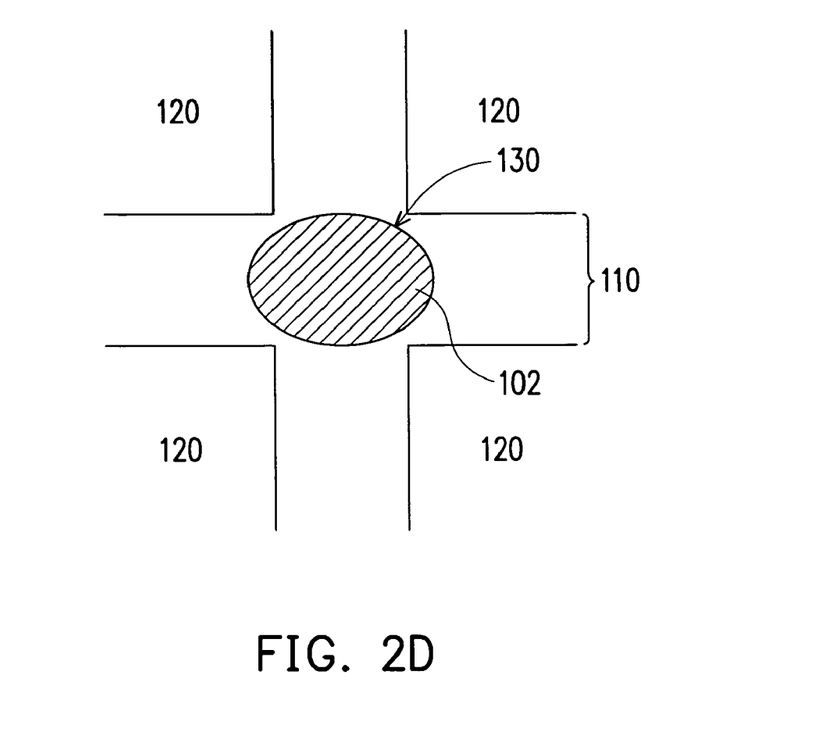
Figure 2E:
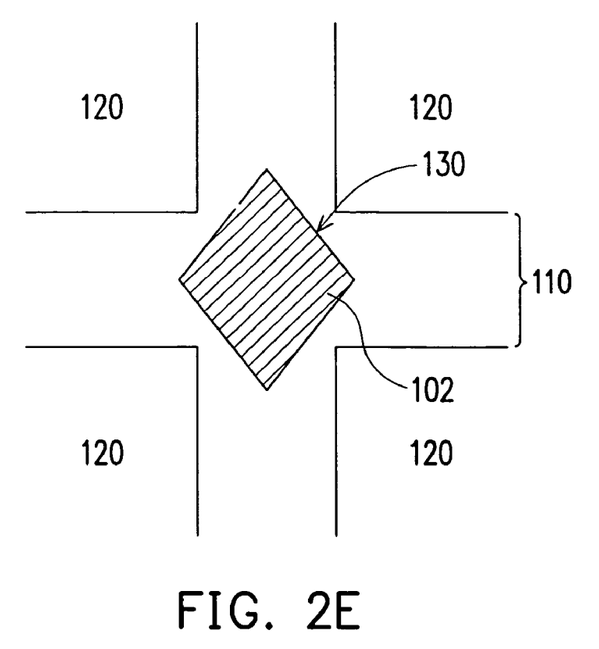

In another embodiment of the present invention, after removing the material layers on the scribe lines corresponding to the corner regions of various dies(area indicated by an arrow having a label 130), further comprises removing the material layers on the cross-junction of the scribe lines 110 to form recess patterns 102 as shown in FIGS. 2A~2F. FIGS. 2A through 2F are magnified top views (the area labeled 140 in FIG. 1) showing various types of recess patterns on the cross-junction area of the scribe lines according to one preferred embodiment of the present invention. FIG. 3 is a schematic cross-sectional view along line I–I' of FIG. 2A.

Figure 2F:
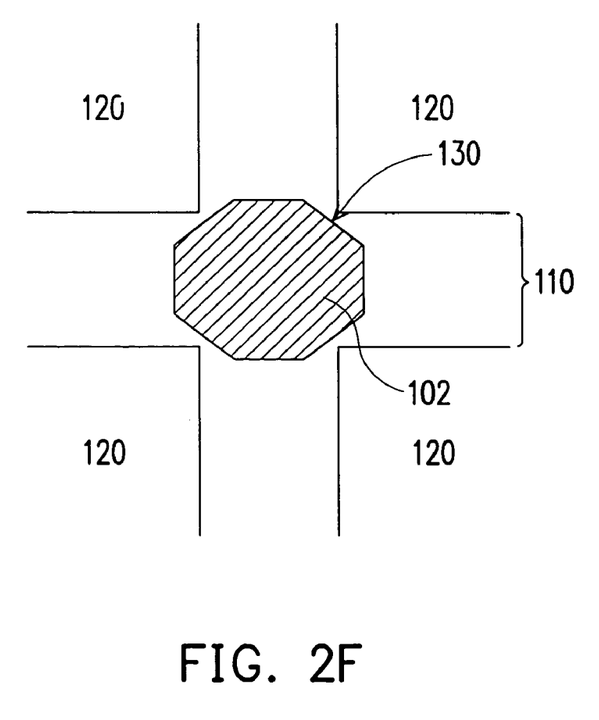
Figure 3:
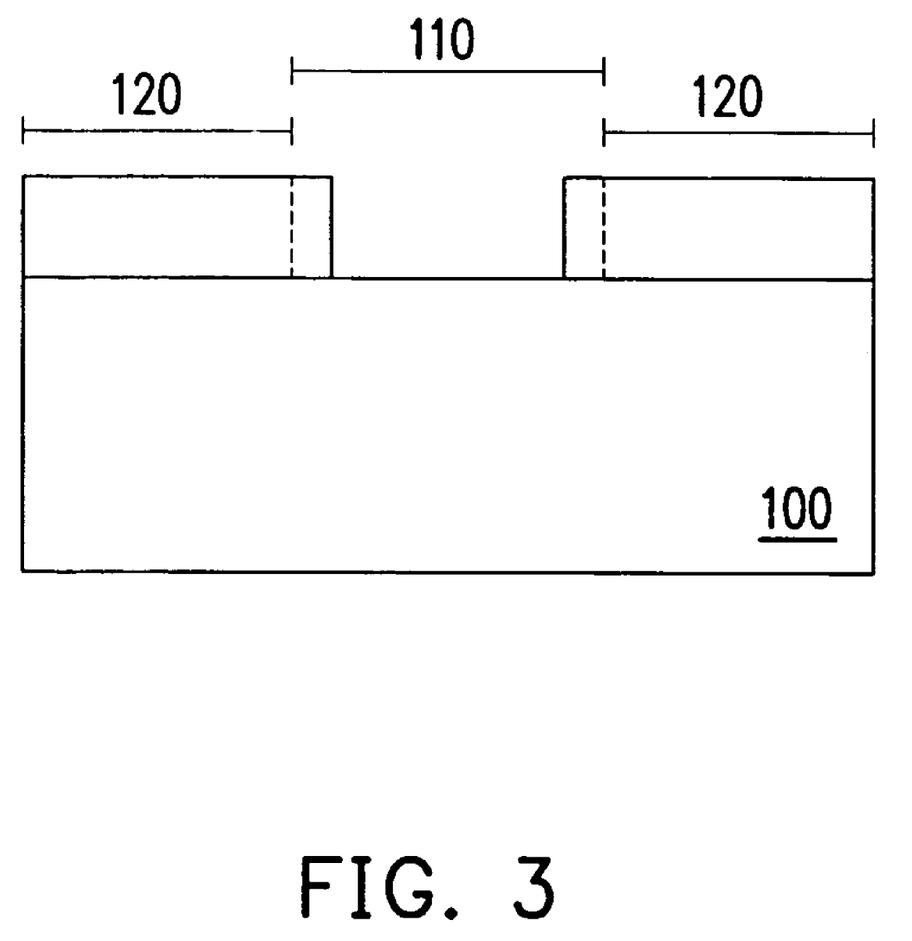
FIG. 3 is a schematic cross-sectional view along line I–I' of FIG. 2A.

The recess pattern 102 can be a normal cross (shown in FIG. 2A), a cross with corner arcs (shown in FIG. 2B), a circular disc (shown in FIG. 2C), an oval disc (shown in FIG. 2D), or a polygon such as a quadrilateral (shown in FIG. 2E) or a octagon (shown in FIG. 2F).

Since the material layers at the cross-junction of the scribe lines 110 where stresses are concentrated have been removed, the probability of chipping and cracking at the corner regions of the dies in a subsequent wafer cutting process is substantially reduced.

Figure 4A:
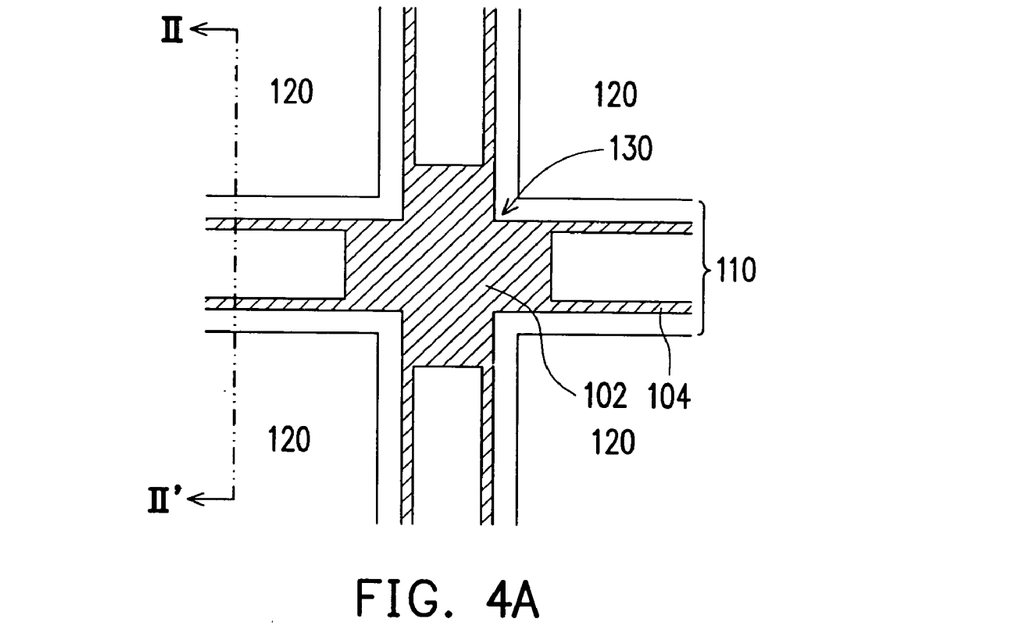
FIGS. 4A and 4B are top views showing recess patterns and trenches formed on the cross-junction area of the scribe lines according to one preferred embodiment of the present invention.
Figure 4B:
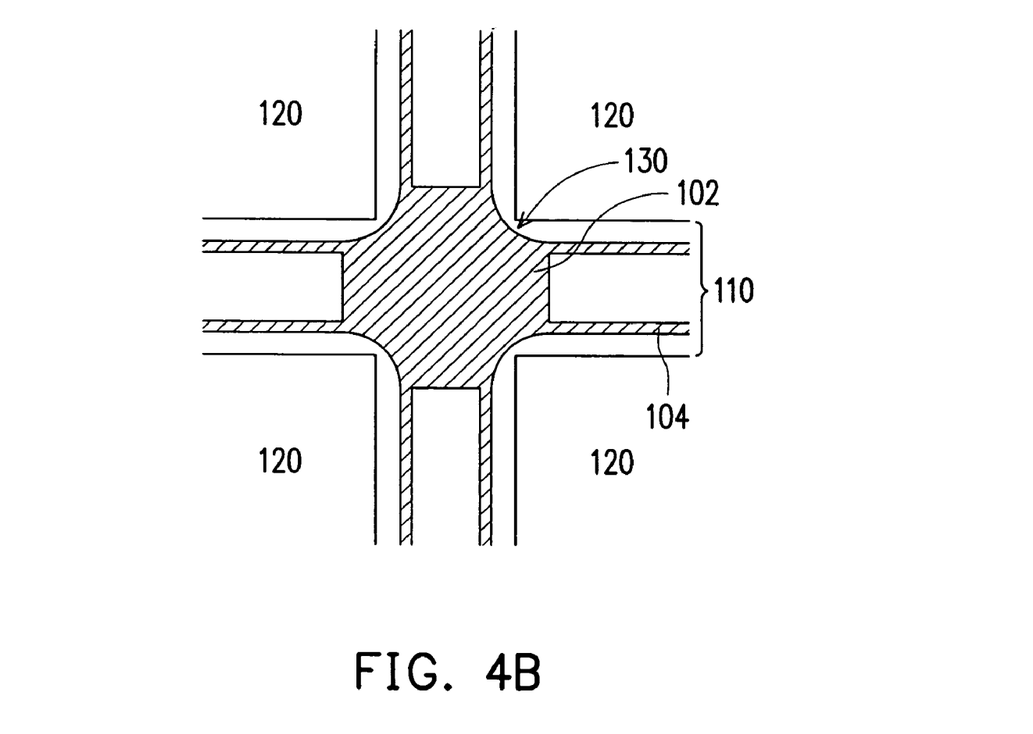
Figure 5:
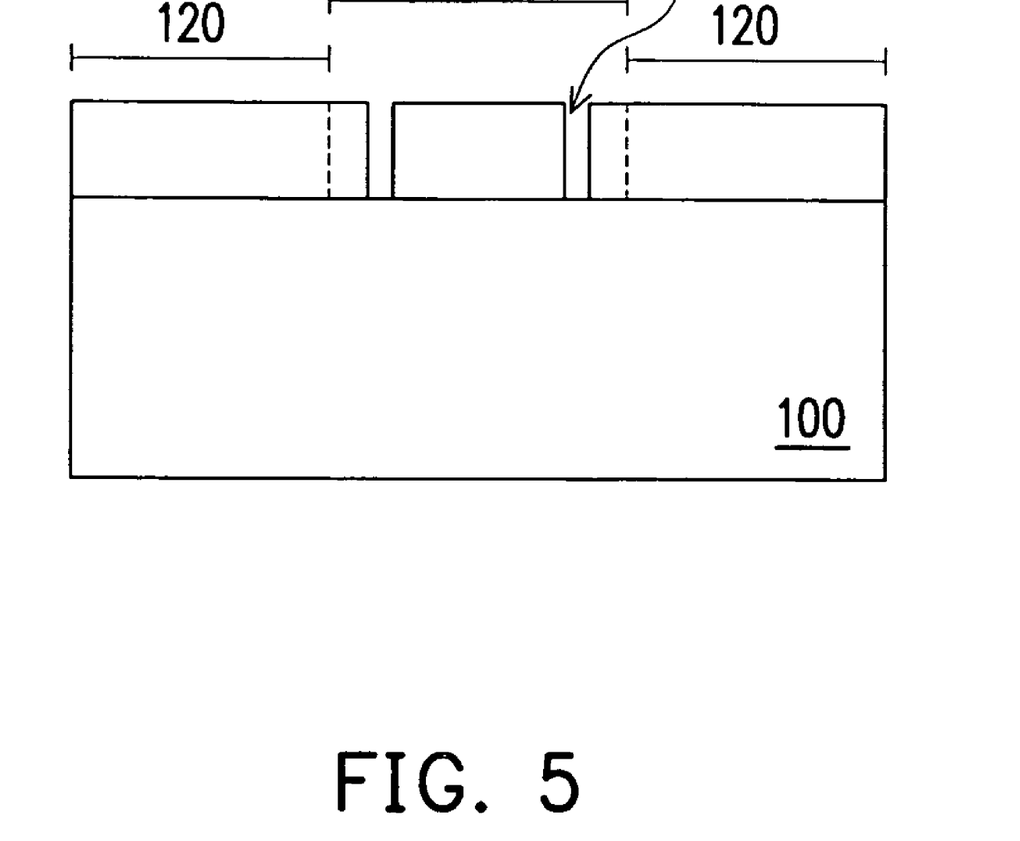
FIG. 5 is a schematic cross-sectional view along line II–II' of FIG. 4A.

In another embodiment of the present invention, aside from the aforementioned step of removing the material layers at the cross-junction of the scribe lines 110, further comprises removing the material layers on the scribe lines 110 corresponding to the sides of various dies 120. Thus, a plurality of trenches 104 are formed on the scribe lines 110 surrounding the dies 120. Using the cross recess pattern 102 (shown in FIG. 2A) as an example, a plurality of trenches 104 is formed on the scribe lines 110 close to the sides of the die 120 as shown in FIG. 4A. FIG. 5 is a schematic cross-sectional view along line II–II' of FIG. 4A. Using the cross with corner arc recess pattern 102 (shown in FIG. 2B) as an example, a plurality of trenches 104 is formed on the scribe lines 110 surrounding various dies 120 as shown in FIG. 4B. In addition, a plurality of trenches (not shown) that surrounds the dies 120 can still be formed to maintain the integrity of dies cut out from the wafer even if the recess pattern has some other forms (for example, the ones shown in FIGS. 2C~2F).

Because the material layers on the scribe lines 110 corresponding to various corners and sides of the dies 120 are removed before cutting, the sides of the dies 120 close to the scribe lines 110 as well as the stress concentrated corner regions are also less vulnerable to cutting damages.

Figure 6A:
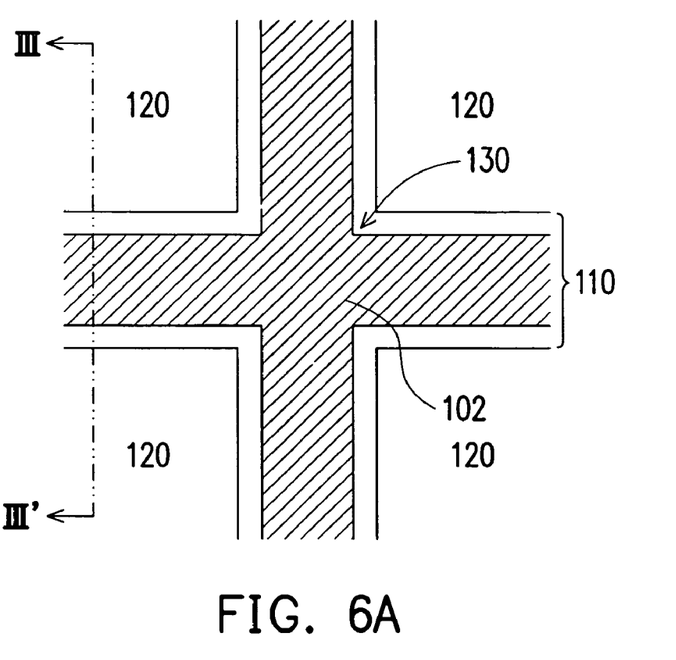
FIGS. 6A and 6B are top views showing a portion of the material layer on the scribe lines removed according to one preferred embodiment of the present invention.
Figure 6B:
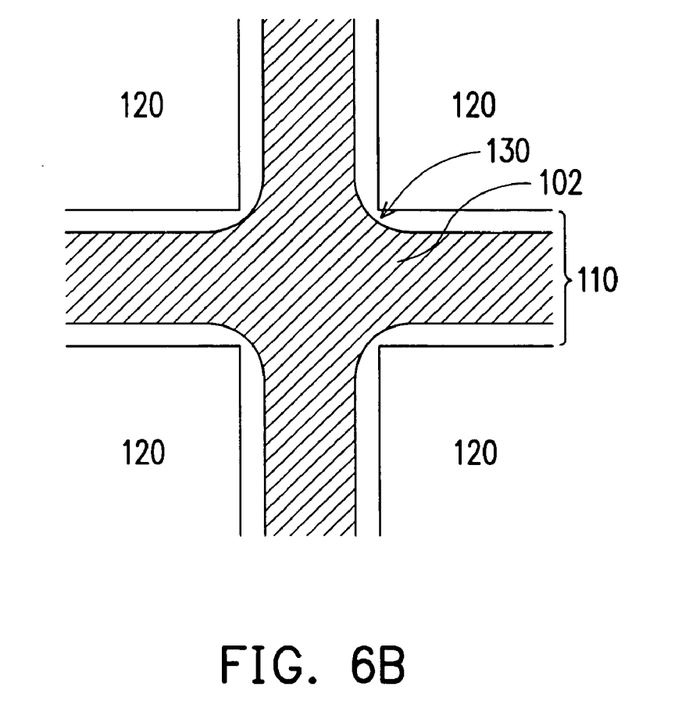
Figure 7:
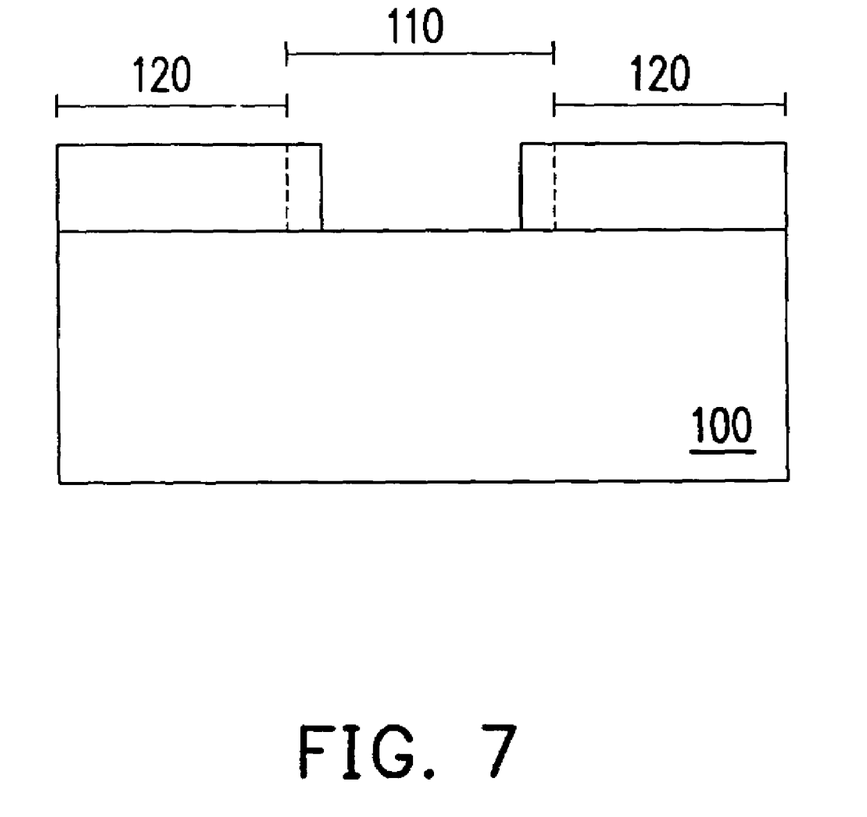
FIG. 7 is a schematic cross-sectional view along line III–III' of FIG. 6A.

In another embodiment of the present invention, the aforementioned step of removing the material layers further comprises removing the material layers on the scribe lines 110 disposed between the trenches 104 as well. Using a cross-shaped recess pattern 102 (as shown in FIG. 2A) as an example, the material layers on the scribe line 110 lying between the trenches 104 are also removed to form the pattern as shown in FIG. 6A. FIG. 7 is a schematic cross-sectional view along line III–III' of FIG. 6A. In addition, using the cross with arc corner recess pattern 102 (as shown in FIG. 2B) as an example, a pattern shown in FIG. 6B is formed on the scribe lines 110. Similarly, the material layers on the scribe lines between the trenches 104 can also be removed to form other patterns (not shown) on the scribe lines 110 when the recess pattern 102 has some other forms (the ones shown in FIGS. 2C~2F). By removing a portion of the material layers on the scribe lines, all these patterns are effective in reducing the amount damage to the scribe lines in wafer cutting process.

Figure 8:
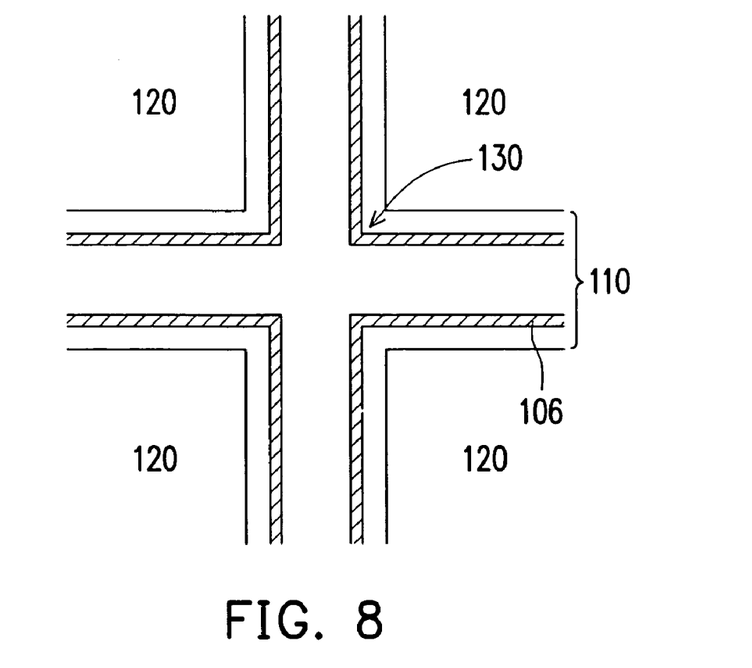
FIG. 8 is a top view showing trenches formed on the scribe lines surrounding the dies according to another preferred embodiment of the present invention.

In another embodiment of the present invention, aside from removing the material layers on the scribe lines corresponding to the corner regions of various dies (area 130 indicated through an arrow), the material layers on the scribe line corresponding to the sides of the dies 120 are also removed to form a plurality of trenches 106 surrounding the dies 120 as shown in FIG. 8.

Figure 9:
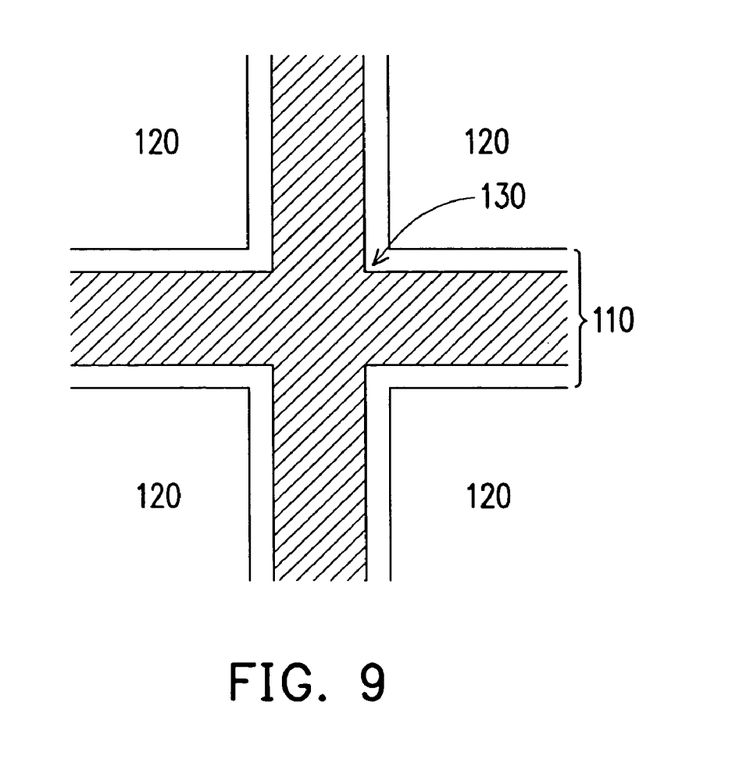
FIG. 9 is a top view showing a portion of the material layer on the scribe lines between various trenches removed according to another preferred embodiment of the present invention.

In yet another embodiment of the present invention, aside from removing the material layers on the scribe lines 110 corresponding to the sides of the dies 120, further comprises removing the material layers on the scribe lines 110 between the trenches 106 to form the pattern shown in FIG. 9.

After the aforementioned pre-processing step for removing a portion of the material layers, a wafer cutting process is carried out using a diamond blade, a laser beam or other suitable means. The wafer cutting process involves running the diamond blade or the laser beam along the scribe lines so that the wafer is dissected to form a plurality of dies. Since the material layers on the scribe lines where stresses are concentrated and the material layers corresponding to the sides of the dies are removed, the dies cut out from the wafer has a high degree of integrity.

In summary, major advantages of the present invention includes:

1. By removing the stack of material layers each having different properties from the scribe lines on the wafer before carrying out the actual wafer cutting process, chipping and cracking along the scribe lines is significantly reduced.

2. By removing the material layers on the scribe line close to the corner regions of the dies before carrying out the actual wafer cutting process, there is far less chipping or cracking at the corner regions of the dies. In other words, the devices on the dies can have greater reliability and a longer life.

3. Furthermore, by removing the material layers on the scribe lines corresponding to the sides of the dies to form a plurality of trenches on the scribe lines surrounding the dies, there is less chipping or cracking not only at the corner regions but also along the sides of the dies. Hence, the dies cut out from the wafer can have a higher degree of integrity and reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pre-process before cutting a wafer comprising the steps of:
   providing a wafer having a plurality of scribe lines and a plurality of dies defined by the scribe lines, wherein at least a material layer covers the wafer; and
   removing the material layer on the scribe lines close to corner regions of the dies and on a cross-junction of the scribe lines to form, at each cross-junction, only one recess pattern exposing a portion of a substrate.

2. The pre-process of claim 1, wherein the recess pattern at the cross-section of the scribe lines has a circular, an oval, a cross or a polygon shape.

3. The pre-process of claim 1, wherein the step of removing the material layer further comprises removing the material layer on the scribe lines corresponding to the sides of the dies to form a plurality of trenches on the scribe lines that surround the dies.

4. The pre-process of claim 3, wherein the step of removing the material layer further comprises removing the material layer on the scribe lines between the trenches.

5. The pre-process of claim 1, wherein the step of removing the material layer comprises performing a laser burning or a patterning process.

6. The pre-process of claim 1, wherein the material layer on the wafer comprises a dielectric layer and a conductive layer.

7. A method of cutting a wafer, comprising the steps of:
   providing a wafer having a plurality of scribe lines and a plurality of dies defined by the scribe lines, wherein at least a material layer covers the wafer;
   removing the material layer of the scribe lines to corner regions of the dies and on a cross-junction of the scribe lines to form, at each cross-junction, only one recess pattern exposing a portion of a substrate; and
   cutting the wafer.

8. The method of claim 7, wherein the recess pattern at the cross-section of the scribe lines has a circular, an oval, a cross or a polygon shape.

9. The method of claim 7, wherein the step of removing the material layer further comprises removing the material layer on the scribe lines corresponding to the sides of the dies to form a plurality of trenches on the scribe lines that surround the dies.

10. The method of claim 9, wherein the step of removing the material layer further comprises removing the material layer on the scribe lines between the trenches.

11. The method of claim 7, wherein the step of removing the material layer comprises performing a laser burning or a patterning process.

12. The method of claim 7, wherein the step of cutting the wafer comprises sawing with a diamond blade or burning with a laser beam.

13. The method of claim 7, wherein the material layer on the wafer comprises at least a dielectric layer and a conductive layer.

* * * * *